United States Patent
Huang et al.

(10) Patent No.: US 8,263,991 B2
(45) Date of Patent: Sep. 11, 2012

(54) LIGHT-EMITTING GALLIUM NITRIDE-BASED III-V GROUP COMPOUND SEMICONDUCTOR DEVICE AND MANUFACTURING METHOD THEREOF

(75) Inventors: Kuo-Chin Huang, Lung Tan (TW);
Shyi-Ming Pan, Lung Tan (TW);
Cheng-Kuo Huang, Lung Tan (TW);
Chi-Yang Chuang, Lung Tan (TW);
Fen-Ren Chien, Lung Tan (TW)

(73) Assignee: Formosa Epitaxy Incorporation, Taoyuan County (TW)

( * ) Notice: Subject to any disclaimer, the term of this patent is extended or adjusted under 35 U.S.C. 154(b) by 300 days.

(21) Appl. No.: 11/979,963

(22) Filed: Nov. 13, 2007

(65) Prior Publication Data
US 2008/0303034 A1    Dec. 11, 2008

(30) Foreign Application Priority Data
Jun. 8, 2007  (TW) ................................ 96120865 A (51) Int. Cl.
*H01L 33/00* (2010.01)
(52) U.S. Cl. ............ 257/98; 257/E33.062; 257/E33.068
(58) Field of Classification Search .................... 257/94, 257/98, 103, E33.062, E33.068
See application file for complete search history.

(56) References Cited

U.S. PATENT DOCUMENTS

| | | | | |
|---|---|---|---|---|
| 5,042,043 A * | 8/1991 | Hatano et al. | ............. | 372/45.012 |
| 5,048,035 A * | 9/1991 | Sugawara et al. | .......... | 372/45.01 |
| 5,161,167 A * | 11/1992 | Murakami et al. | ......... | 372/46.01 |
| 5,499,260 A * | 3/1996 | Takahashi et al. | ....... | 372/46.015 |
| 5,583,880 A * | 12/1996 | Shakuda | ..................... | 372/46.01 |
| 5,732,098 A * | 3/1998 | Nisitani et al. | ............. | 372/45.01 |
| 5,789,768 A * | 8/1998 | Lee et al. | ......................... | 257/96 |
| 5,814,838 A * | 9/1998 | Ohtsuka et al. | ................. | 257/94 |
| 5,814,839 A * | 9/1998 | Hosoba | ............................ | 257/96 |
| 5,970,080 A * | 10/1999 | Hata | ........................... | 372/45.01 |
| 6,020,602 A * | 2/2000 | Sugawara et al. | ............. | 257/103 |
| 6,063,643 A * | 5/2000 | Dutta | ............................... | 438/39 |
| 6,072,819 A * | 6/2000 | Shakuda | ...................... | 372/46.01 |
| 6,111,275 A * | 8/2000 | Hata | ............................... | 257/97 |
| 6,221,684 B1 * | 4/2001 | Sugawara et al. | ............... | 438/47 |
| 6,229,834 B1 * | 5/2001 | Nisitani et al. | ............. | 372/45.01 |
| 6,242,761 B1 * | 6/2001 | Fujimoto et al. | ................. | 257/94 |
| 6,420,732 B1 * | 7/2002 | Kung et al. | ..................... | 257/79 |
| 6,465,812 B1 * | 10/2002 | Hosoba et al. | ................ | 257/103 |
| 6,472,687 B1 * | 10/2002 | Wu et al. | ......................... | 257/79 |

(Continued)

*Primary Examiner* — Long Tran
*Assistant Examiner* — Jordan Klein
(74) *Attorney, Agent, or Firm* — Rosenberg, Klein & Lee (57) ABSTRACT

A light-emitting gallium nitride-based III-V group compound semiconductor device and a manufacturing method thereof are disclosed. The light emitting device includes a substrate, a n-type semiconductor layer over the substrate, an active layer over the n-type semiconductor layer, a p-type semiconductor layer over the active layer, a conductive layer over the p-type semiconductor layer, a first electrode disposed on the conductive layer and a second electrode arranged on exposed part of the n-type semiconductor layer. A resistant reflective layer or a contact window is disposed on the p-type semiconductor layer, corresponding to the first electrode so that current passes beside the resistant reflective layer or by the contact window to the active layer for generating light. When the light is transmitted to the conductive layer for being emitted, it is not absorbed or shielded by the first electrode. Thus the current is distributed efficiently over the conductive layer. Therefore, both LED brightness and efficiency are improved. Moreover, adhesion between the conductive layer and the p-type semiconductor layer is improved so that metal peel-off problem during manufacturing processes can be improved.

9 Claims, 7 Drawing Sheets

U.S. PATENT DOCUMENTS

| | | | |
|---|---|---|---|
| 6,492,661 B1 * | 12/2002 | Chien et al. | 257/98 |
| 6,495,862 B1 * | 12/2002 | Okazaki et al. | 257/103 |
| 6,693,352 B1 * | 2/2004 | Huang et al. | 257/743 |
| 6,794,688 B2 * | 9/2004 | Nakatsu et al. | 257/98 |
| 6,797,990 B2 * | 9/2004 | Udagawa | 257/102 |
| 7,009,214 B2 * | 3/2006 | Yang et al. | 257/98 |
| 7,101,061 B2 * | 9/2006 | Nagai et al. | 362/294 |
| 2005/0184300 A1 * | 8/2005 | Tazima et al. | 257/94 |
| 2005/0236632 A1 * | 10/2005 | Lai et al. | 257/94 |
| 2006/0001032 A1 * | 1/2006 | Murofushi et al. | 257/79 |
| 2006/0012991 A1 * | 1/2006 | Weaver et al. | 362/235 |
| 2006/0278880 A1 * | 12/2006 | Lee et al. | 257/79 |

* cited by examiner

LIGHT-EMITTING GALLIUM NITRIDE-BASED III-V GROUP COMPOUND SEMICONDUCTOR DEVICE AND MANUFACTURING METHOD THEREOF

BACKGROUND OF THE INVENTION

The present invention relates to a light-emitting gallium nitride-based III-V group compound semiconductor device and a manufacturing method thereof, especially to a light-emitting gallium nitride-based III-V group compound semiconductor device with high resistance as well as reflection and a manufacturing method thereof.

Now scientists in various countries are dedicated to developing new LED material and improving the internal quantum efficiency of LED. However, the external quantum efficiency of LED is not improved so that there is a great difference between the external quantum efficiency and the internal quantum efficiency of LED. The reason that the external quantum efficiency of LED is not improved is in that: due to distribution of current in the p-type semiconductor layer over the active layer of the LED, photons generated from the active layer are shielded and reflected by the electrode over the p-type semiconductor layer and the photons also absorbed by the substrate of the LED. Therefore, probability of photons to be emitted from the LED is reduced.

A conventional light emitting diode includes at least a substrate, a n-type semiconductor layer over the substrate, a light emitting layer, and a p-type semiconductor layer, a first electrode disposed on one side of the substrate that is opposite to the n-type semiconductor layer and a second electrode arranged on the p-type semiconductor layer. When a voltage is applied to the LED, the current flows to the light emitting layer through the second electrode and photons are generated in the light emitting layer. Because the p-type semiconductor layer has higher resistance so that transverse current spreading in the p-type semiconductor layer is not easy. Thus most of current accumulate on bottom side of the second electrode and then when the photons generated from the light emitting layer under the second electrode are emitted from the LED, the photons are reflected by the second electrode and further absorbed by the substrate. Therefore, the external quantum efficiency of the LED is dramatically reduced. Such prior art can't meet requirements of users so that there is a need to provide a LED with high resistance and reflection for improving light emitting efficiency of LEDs.

SUMMARY OF THE INVENTION

Therefore it is a primary object of the present invention to provide a light-emitting gallium nitride-based III-V group compound semiconductor device and a manufacturing method thereof. The LED is added with a resistant and reflective layer or is etched to form a contact window so as to make current flows beside thereof to the active layer for generating light. Thus when the light sent to the conductive layer is emitted, the light is not absorbed or shielded by the first electrode. The current is effectively spread across the conductive layer. Therefore, the brightness and light emitting efficiency of the LED are increased.

It is another object of the present invention to provide a light-emitting gallium nitride-based III-V group compound semiconductor device and a manufacturing method thereof that form a resistant and reflective layer on the LED or have a contact window on the p-type semiconductor layer by etching, corresponding to the first electrode. Thus adhesion between the conductive layer and the p-type semiconductor layer is increased so that metal peel-off problem during manufacturing processes is improved.

In order to achieve above objects, the present invention provides a light-emitting gallium nitride-based III-V group compound semiconductor device and a manufacturing method thereof. The light-emitting gallium nitride-based III-V group compound semiconductor device includes a substrate, a n-type semiconductor layer, an active layer, a p-type semiconductor layer, a resistant and reflective layer, a conductive layer, a first electrode and a second electrode. The manufacturing method consists the following steps. Firstly, providing a substrate and then form a n-type semiconductor layer over the substrate. Next an active layer is formed over the n-type semiconductor layer and a p-type semiconductor layer is formed over the active layer. Perform an etching process on the p-type semiconductor layer, the active layer and the n-type semiconductor layer to expose part of the n-type semiconductor layer. Then a resistant and reflective layer is formed over the p-type semiconductor layer while a conductive layer is formed over the resistant and reflective layer as well as the p-type semiconductor layer. A first electrode is arranged over the conductive layer and the first electrode is corresponding to the resistant and reflective layer. At last, a second electrode is formed over the exposed part of the n-type semiconductor layer.

After applying a voltage to the LED, a current generated passes beside the resistant and reflective layer and arrives the active layer so as to make the active layer generate light. The light from the active layer passes through the resistant and reflective layer and then emits out effectively without being shielded or absorbed by the first electrode.

Another light-emitting gallium nitride-based III-V group compound semiconductor device of the present invention is composed of a substrate, a n-type semiconductor layer over the substrate, an active layer over the n-type semiconductor layer, a p-type semiconductor layer with a contact window over the active layer, a conductive layer over the p-type semiconductor layer with the contact window, a first electrode disposed on the conductive layer and corresponding to the contact window, and a second electrode arranged on exposed part of the n-type semiconductor layer. The manufacturing method of the light emitting device includes the steps of providing a substrate firstly. Form the n-type semiconductor layer over the substrate and then form the active layer over the n-type semiconductor layer. Next form the p-type semiconductor layer over the active layer and perform an etching process on the p-type semiconductor layer, the active layer and the n-type semiconductor layer so as to make part of the n-type semiconductor layer expose. Form the conductive layer and the contact window on the p-type semiconductor layer. The first electrode is formed on the conductive layer and is corresponding to the resistant and reflective layer. Finally, form the second electrode on exposed part of the n-type semiconductor layer. Moreover, before the conductive layer being formed over the p-type semiconductor layer, a resistant and reflective layer is formed over the resistant and reflective layer and is filled the contact window.

After applying voltage to the light emitting device, the current generated passes beside the contact window

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1A:
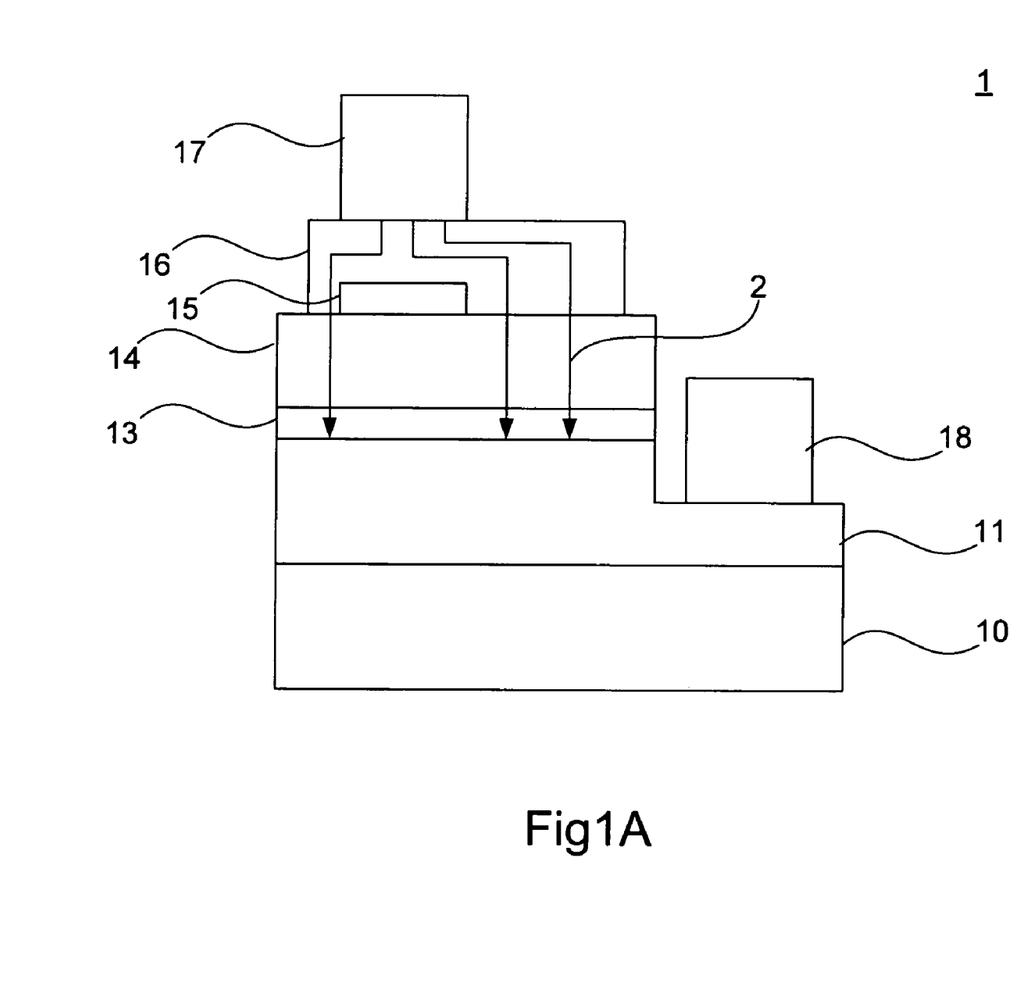
FIG. 1A is a schematic drawing showing structure of an embodiment of a light emitting device according to the present invention.
Figure 1B:
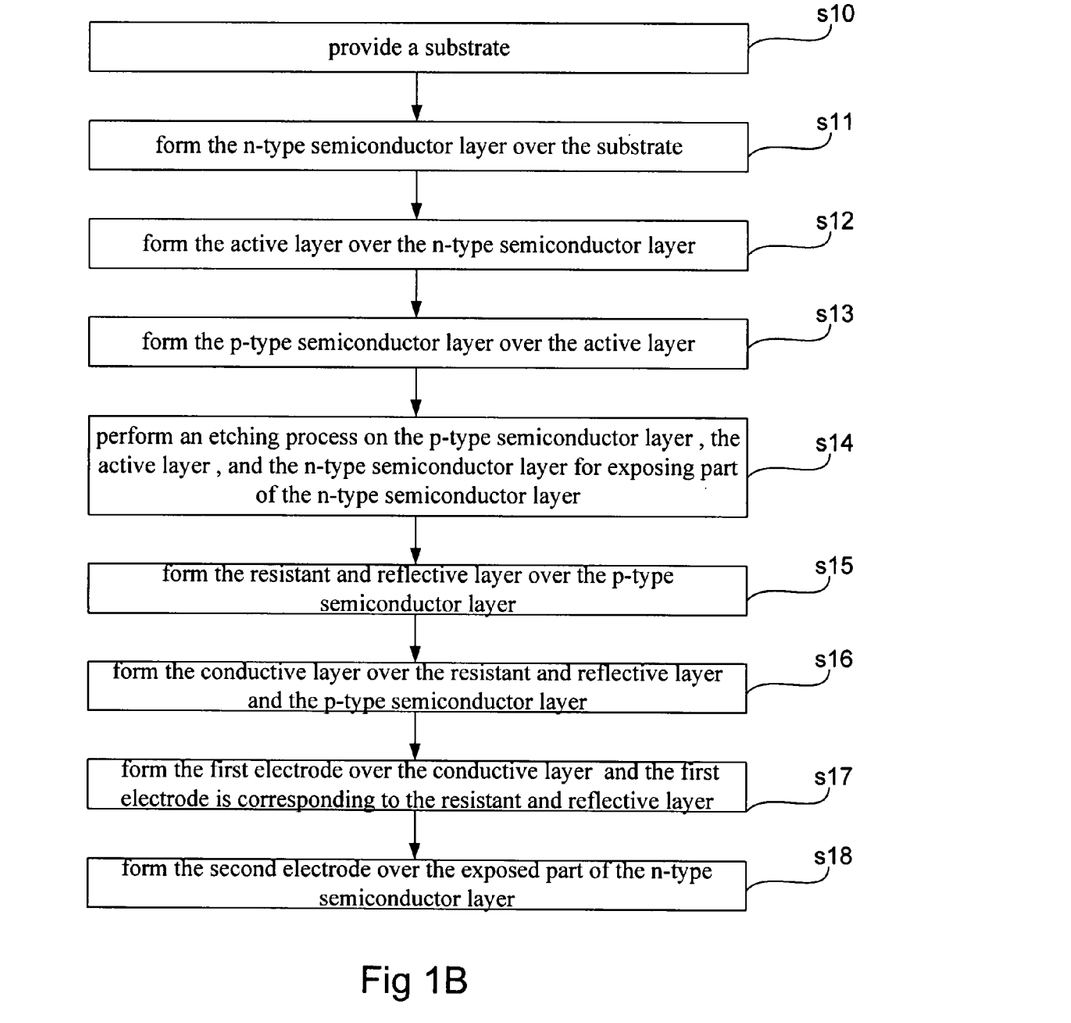
FIG. 1B is a flow chart showing a manufacturing of the light emitting device according to the present invention.

Refer to FIG. 1A, a light-emitting gallium nitride-based III-V group compound semiconductor device 1 of the present invention includes a substrate 10, a n-type semiconductor layer 11, an active layer 13, a p-type semiconductor layer 14, a resistant and reflective layer 15, a conductive layer 16, a first electrode 17 and a second electrode 18. Refer to FIG. 1B, a manufacturing method of the light-emitting gallium nitride-based III-V group compound semiconductor device of the present invention consists of following steps:

Firstly, refer to step S10, provide a substrate 10 that is made from one of the following material: aluminum oxide ($Al_2O_3$), silicon carbide (SiC), gallium arsenide (GaAs), gallium nitride (GaN), aluminum nitride (AlN), gallium phosphide (GaP), silicon (Si), zinc oxide (ZnO), and manganese oxide (MnO), or their combinations. Then run the step S11, form the n-type semiconductor layer 11 over the substrate 10 and the semiconductor layer 11 is a n-type gallium nitride semiconductor layer and is made from aluminum nitride, gallium nitride, aluminum gallium nitride, indium gallium nitride, aluminum indium gallium nitride (AlInGaN) or other compounds with at least one of aluminum, indium and gallium.

Next, run the step S12, form the active layer 13 over the n-type semiconductor layer 11. The active layer 13 is with multiple quantum wells and is made from aluminum nitride, gallium nitride, aluminum gallium nitride, indium gallium nitride, aluminum indium gallium nitride (AlInGaN) or other compounds with at least one of aluminum, indium and gallium. Refer to the step S13, form the p-type semiconductor layer 14 over the active layer 13 and the p-type semiconductor layer 14 is a p-type gallium nitride semiconductor layer and is made from aluminum nitride, gallium nitride, aluminum gallium nitride, indium gallium nitride, aluminum indium gallium nitride (AlInGaN) or other compounds with at least one of aluminum, indium and gallium.

Take the step S14, perform an etching process on the p-type semiconductor layer 14, the active layer 13, and the n-type semiconductor layer 11 for exposing part of the n-type semiconductor layer 11. Run the step S15, form the resistant and reflective layer 15 over the p-type semiconductor layer 14. The resistant and reflective layer 15 is a dielectric reflective layer or a metal reflective layer. The dielectric reflective layer is made from silicon dioxide, silicon monoxide, silicon tetranitride, nitride, amorphous semiconductor, non-crystal semiconductor, zinc oxide, nickel oxide, titanium dioxide, oxide or combinations of them while the dielectric reflective layer can also be combinations of at least two materials with different refractive index. The metal reflective layer is made from Al, Ag, Pt, Ni, Cr, Pd, Sn, Au, Zn, Ti, Pb, Ge, Cu, gold beryllium (AuBe), gold germanium (AuGe), lead tin (PbSn), gold zinc (AuZn) or their combinations. The metal reflective layer can also be a plurality of metal particles that are chromium particles, nickel particles, aluminum particles, silver particles, or titanium particles.

Then run the step S16, form the conductive layer 16 over the resistant and reflective layer 15 and the p-type semiconductor layer 14. The conductive layer 16 is made from Ni/Au, indium tin oxide, cadmium tin oxide, antinomy tin oxide, conductive transparent adhesive or their combinations. Take the step S17, form the first electrode 17 over the conductive layer 16 and the first electrode 17 is corresponding to the resistant and reflective layer 15. Finally, run the step S18, form the second electrode 18 over the exposed part of the n-type semiconductor layer 11.

The present invention features on that the resistant and reflective layer 15 is disposed on the p-type semiconductor layer 14 on the position corresponding to the first electrode 17. As to the conventional LED, after applying a voltage to the first electrode 17 and the second electrode 18, a current 2 is generated and is send from the conductive layer 16 to the active layer 13 so as to make the active layer 13 generate light. Due to higher resistance of the p-type semiconductor layer 14, spreading of the current 2 is difficult so that the current 2 accumulates under the first electrode 17. When the light turns to surface of the conductive layer 16 to emit out, it will be shielded or absorbed by the first electrode 17. Thus light emitting efficiency of the LED is largely reduced. In order to solve above problem, the LED 1 according to the present invention is disposed with the resistant and reflective layer 15 so that the current 2 passes beside the resistant and reflective layer 15 and there is no current passing through under the resistant and reflective layer 15. The current 2 arrives the active layer 13 to generate light and the light is sent from the active layer 13 so that the light is effectively emitted through the resistant and reflective layer 15 without being absorbed or shielded by the first electrode 17. Therefore, brightness and light emitting efficiency of the LED 1 are increased.

Figure 1C:
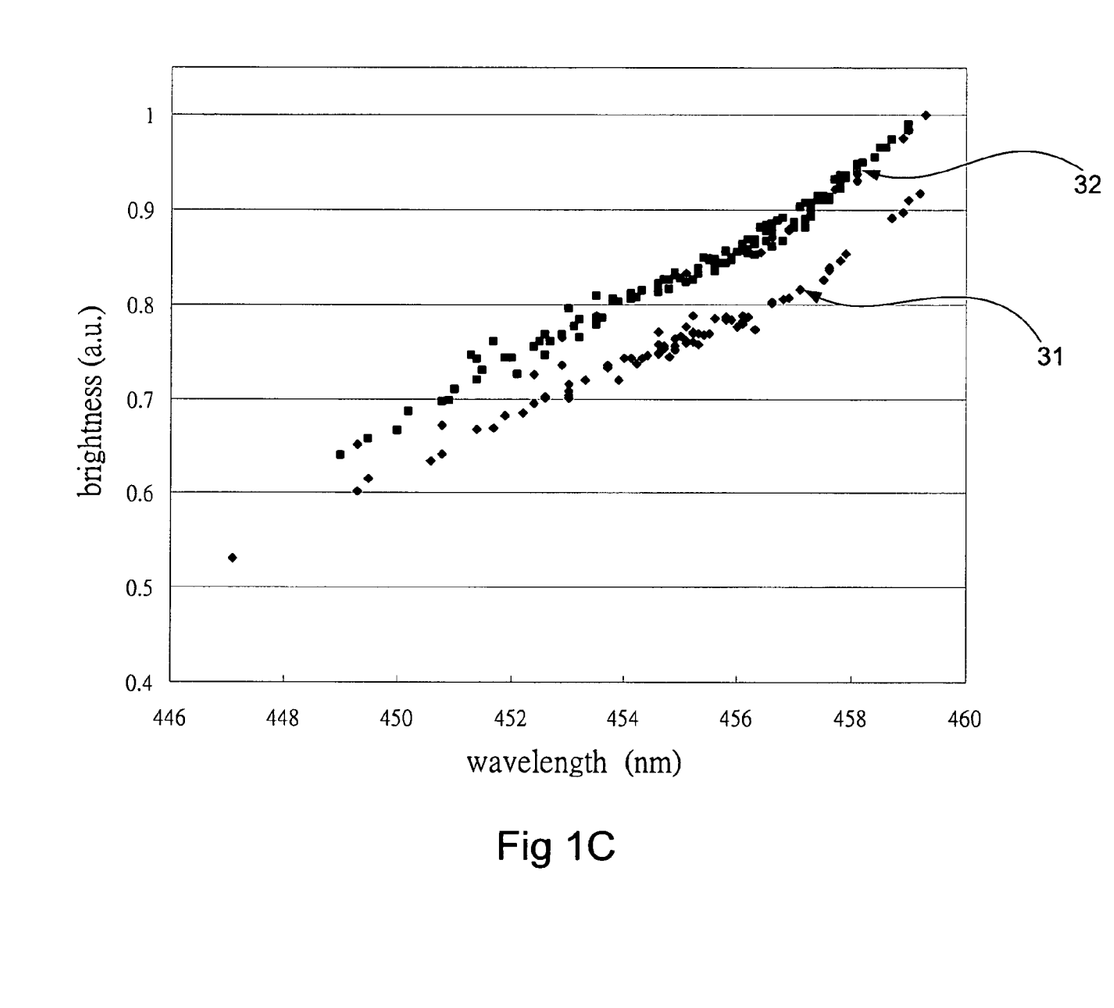
FIG. 1C shows relationship between brightness and wavelength of the light emitting device according to the present invention.

Refer to FIG. 1C, it shows relationship between brightness of LED and wavelength. As shown in figure, there are two curves—a first curve 31 and a second curve 32. The first curve 31 represents results of LED without addition of the resistant and reflective layer while the second curve 32 represents results of the embodiment of the LED in FIG. 1A. It is found from the first curve 31 and the second curve 32 that brightness of the LED of the present invention is larger than the LED without addition of the resistant and reflective layer.

Figure 2:
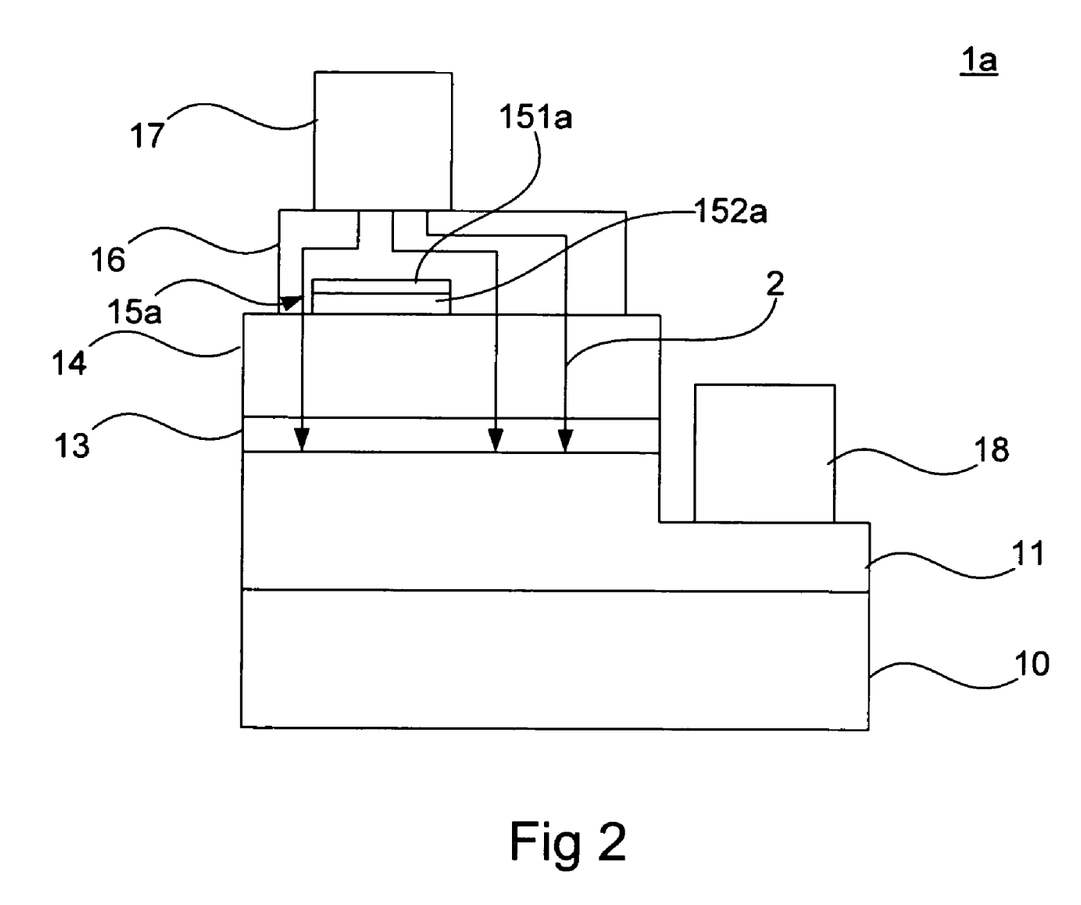
FIG. 2 is a schematic drawing showing structure of another embodiment of a light emitting device according to the present invention.

Refer to FIG. 2, another embodiment of the present invention is disclosed. A light-emitting gallium nitride-based III-V group compound semiconductor device 1a of the present invention is composed of a substrate 10, a n-type semiconductor layer 11 over the substrate 10, an active layer 13 over the n-type semiconductor layer 11, a p-type semiconductor layer 14 over the active layer 13, a resistant and reflective layer 15a disposed over the p-type semiconductor layer 14, a conductive layer 16 over the p-type semiconductor layer 14, a first electrode 17 disposed on the conductive layer 16 and corresponding to the resistant and reflective layer 15a, and a second electrode 18 arranged on exposed part of the n-type semiconductor layer 11. The resistant and reflective layer 15a of this embodiment is a dielectric reflective layer 152a and a metal reflective layer 151a. The dielectric reflective layer 152a is disposed over the p-type semiconductor layer 14 while the metal reflective layer 151a is arranged over the dielectric reflective layer 152a. Moreover, the dielectric reflective layer 152a can also be arranged over the metal reflective layer 151a.

Figure 3A:
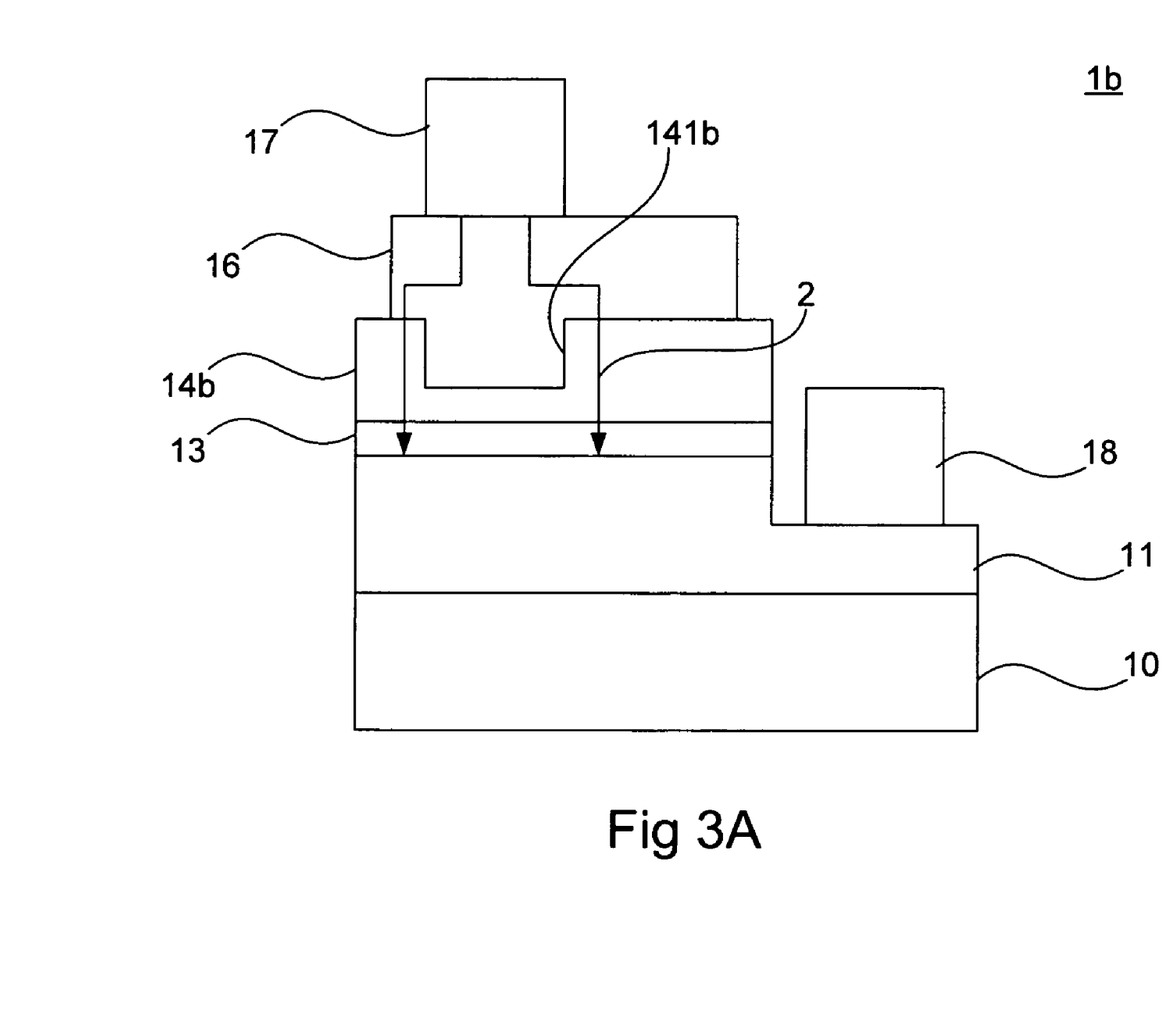
FIG. 3A is a schematic drawing showing structure of a further embodiment of a light emitting device according to the present invention.
Figure 3B:
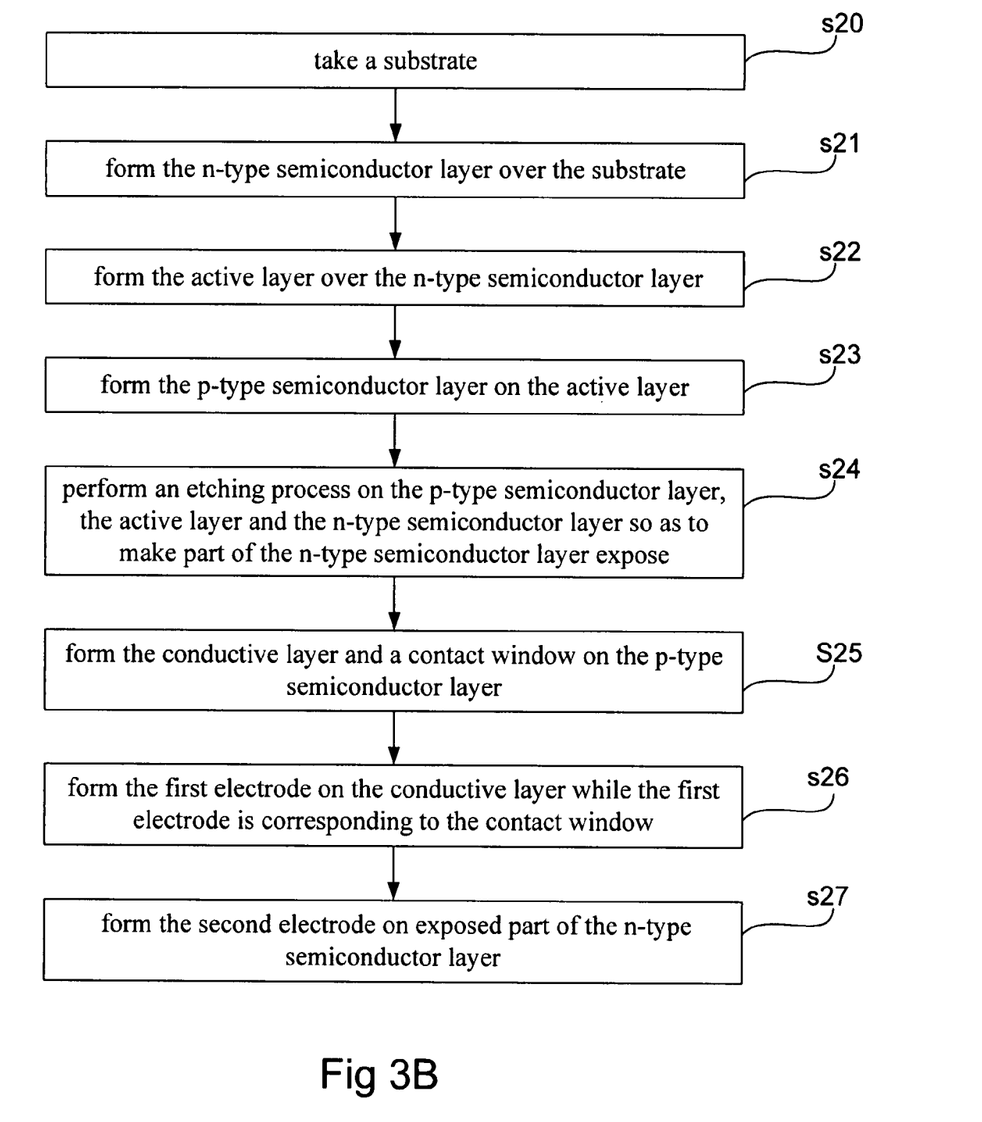
FIG. 3B is a flow chart showing a manufacturing of the light emitting device according to the present invention.

Refer to FIG. 3A, a further embodiment is revealed. A light-emitting gallium nitride-based III-V group compound semiconductor device 1b of the present invention includes a substrate 10, a n-type semiconductor layer 11, an active layer 13, a p-type semiconductor layer 14b, a conductive layer 16, a first electrode 17 and a second electrode 18. Refer to FIG. 3B, a manufacturing method of the light-emitting gallium nitride-based III-V group compound semiconductor device 1b of the present invention consists of following steps:

firstly, refer to step S20, take a substrate 10. Then run the step S21, form the n-type semiconductor layer 11 over the substrate 10. Next run the step S22, form the active layer 13 over the n-type semiconductor layer 11. Take the step S23, form the p-type semiconductor layer 14b on the active layer 13. The run the step S24, perform an etching process on the p-type semiconductor layer 14b, the active layer 13 and the n-type semiconductor layer 11 so as to make part of the n-type semiconductor layer 11 expose. Refer to step S25, form the conductive layer 16 and a contact window 141b on the p-type semiconductor layer 14b. The conductive layer 16 fills the contact window 141b while the contact window 141b is formed by an etching process or an ion implantation process. The etching process is a dry etching process, a wet etching process or combinations of them. Then take the step S26, form the first electrode 17 on the conductive layer 16 while the first electrode 17 is corresponding to the contact window 141b. Finally, run the step S27, form the second electrode 18 on exposed part of the n-type semiconductor layer 11.

Figure 4:
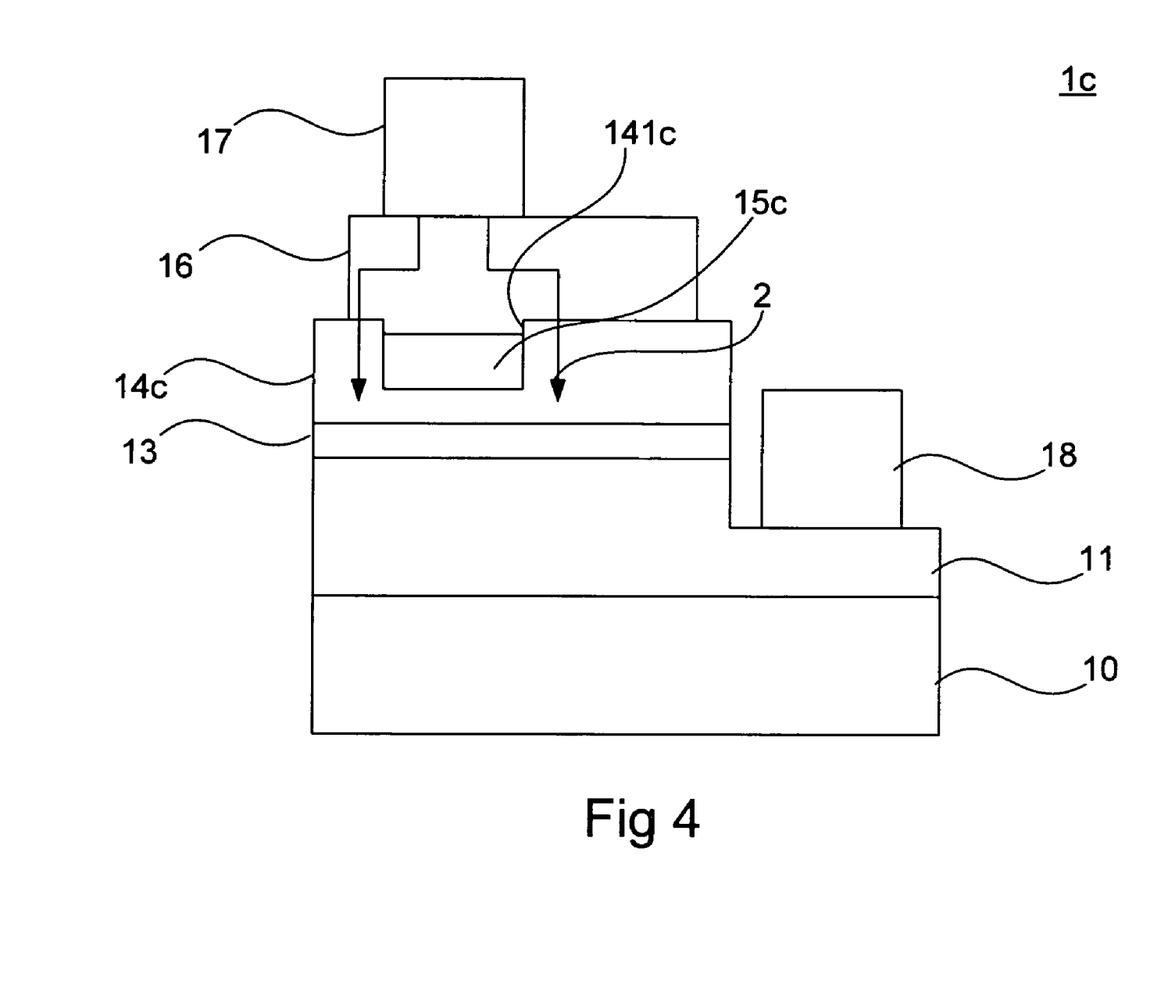
FIG. 4 is a schematic drawing showing structure of a further embodiment of a light emitting device according to the present invention.

This embodiment features on that the contact window 141b is formed on the p-type semiconductor layer 14 by the etching process or the ion implantation process, corresponding to the first electrode 17. Through the etching process, the contact window 141b forms a high resistance layer. When the voltage is applied to the first electrode 17 and the second electrode 18, a current 2 generates. While contacting with the high resistance layer formed by the contact window 141b, the current 2 passes beside the contact window 141b so that here is not current flowing under the contact window 141b. Thus the current is effectively distributed over the active layer. The current 2 is sent to the active layer 13 for generating light and the light from the active layer 13 passes through the resistant and reflective layer, then being radiated without shielded and absorbed by the first electrode 17. Therefore, both brightness and efficiency of the LED are improved Refer to FIG. 4, a further embodiment of the present invention is disclosed. A light-emitting gallium nitride-based III-V group compound semiconductor device 1c of the present invention includes a substrate 10, a n-type semiconductor layer 11 disposed over the substrate 10, an active layer 13 arranged over the n-type semiconductor layer 11, a p-type semiconductor layer 14c having a contact window 141c arranged over the active layer 13, a resistant and reflective layer 15c disposed over the p-type semiconductor layer 14c with the contact window 141c, a conductive layer 16 arranged over the resistant and reflective layer 15c as well as the p-type semiconductor layer 14c having a contact window 141c, a first electrode 17 disposed over the conductive layer 16 and corresponding to the resistant and reflective layer 15c, and a second electrode 18 arranged over exposed part of the n-type semiconductor layer 11. The resistant and reflective layer 15c of this embodiment is a dielectric reflective layer or a metal reflective layer and the contact window 141c of the p-type semiconductor layer 14c is filled in with the dielectric reflective layer or the metal reflective layer of the resistant and reflective layer 15c.

In summary, a light-emitting gallium nitride-based III-V group compound semiconductor device and a manufacturing method thereof are provided by the present invention. The light-emitting device is with high resistance and reflection so that the current is not vertically transmitted to the active layer and is distributed effectively over the active layer. Thus light passes through the resistant and reflective layer to be emitted out, without being shielded or absorbed by the first electrode. Therefore, light-emitting efficiency and brightness are improved. Moreover, adhesion between the conductive layer and the p-type semiconductor layer is improved so that metal peel-off problem during manufacturing processes can be improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-emitting gallium nitride-based III-V group compound semiconductor device, comprising:
   a substrate;
   an n-type semiconductor layer disposed over the substrate, said n-type semiconductor layer having an exposed and non-exposed areas;
   an active layer arranged over said non-exposed area of the n-type semiconductor layer, said active layer generating light;
   a p-type semiconductor layer arranged over the active layer;
   a resistant and reflective layer including a reflective layer made from a material selected from a group consisting of a metal and a dielectric, and being disposed over the p-type semiconductor layer, said resistant and reflective layer redirecting electrical current directed thereto toward areas surrounding said resistant and reflective layer, wherein the reflective layer is made from combinations of at least two materials with different refractive indices and the reflective layer is the bottom of the resistant and reflective layer and is disposed on the p-type semiconductor layer;
   a conductive layer arranged over the p-type semiconductor layer and the resistant and reflective layer, said conductive layer being in contiguous contact with said p-type semiconductor layer around said resistant and reflective layer;
   a first electrode disposed on the conductive layer and corresponding to the resistant and reflective layer, the first electrode having side surfaces in vertically aligned relationship with corresponding side surfaces of the resistant and reflective layer;
   a second electrode arranged on said exposed area of the n-type semiconductor layer, said second electrode being laterally displaced from said first electrode;
   wherein, upon applying a voltage to the first electrode and the second electrode, a current is generated and passes to said active layer around the resistant and reflective layer, thereby causing the active layer to generate the light, wherein the light passes through the resistant and reflective layer and emits from said light-emitting device effectively.

2. The device as claimed in claim 1, wherein the resistant and reflective layer further includes combinations of said dielectric and metal reflective layers.

3. The device as claimed in claim 1, wherein the dielectric reflective layer is made from silicon dioxide, silicon monoxide, silicon tetranitride, nitride, amorphous semiconductor, non-crystal semiconductor, zinc oxide, nickel oxide, titanium dioxide, oxide or combinations of them.

4. The device as claimed in claim 1, wherein the metal reflective layer comprises a plurality of metal particles.

5. A light-emitting gallium nitride-based III-V group compound semiconductor device, comprising:
   a substrate;
   an n-type semiconductor layer disposed over the substrate, said n-type semiconductor layer having an exposed and a non-exposed areas;
   an active layer arranged over said non-exposed area of the n-type semiconductor layer, said active layer generating light;
   a p-type semiconductor layer disposed on said active layer and having a contact window formed therein;
   a resistant and reflective layer received within said contact window and including a reflective layer made from a material selected from a group consisting of a metal and a dielectric, said resistant and reflective layer redirecting electrical current directed thereto toward areas surrounding said resistant and reflective layer, wherein the dielectric reflective layer is made from combinations of at least two materials with different refractive indices;
   a conductive layer arranged over said contact window formed in the p-type semiconductor layer and said resistant and reflective layer within said contact window;
   a first electrode disposed on the conductive layer and in correspondence with the contact window, said resistant and reflective layer being separated from said first electrode by said conductive layer, the first electrode having side surfaces in vertically aligned relationship with corresponding side surfaces of the resistant and reflective layer; and
   a second electrode arranged on said exposed area of the n-type semiconductor layer, said second electrode being laterally displaced from said first electrode;
   wherein, upon applying a voltage to the first electrode and the second electrode, a current is generated and passes to said active layer around the contact window filled with said resistant and reflective layer, and wherein the generated current is effectively spread over the active layer.

6. The device as claimed in claim 5, wherein the contact window is formed by an etching process or an ion implantation process.

7. The device as claimed in claim 5, wherein the resistant and reflective layer further includes combinations of said dielectric and metal reflective layers.

8. The device as claimed in claim 5, wherein the dielectric reflective layer is made from silicon dioxide, silicon monoxide, silicon tetranitride, nitride, amorphous semiconductor, non-crystal semiconductor, zinc oxide, nickel oxide, titanium dioxide, oxide or combinations of them.

9. The device as claimed in claim 5, wherein the metal reflective layer comprises a plurality of metal particles.

* * * * *